US008021726B2

(12) United States Patent
Ionkin

(10) Patent No.: US 8,021,726 B2
(45) Date of Patent: Sep. 20, 2011

(54) COMPOSITIONS AND PROCESSES FOR PREPARING COLOR FILTER ELEMENTS USING ALKALI METAL FLUORIDES

(75) Inventor: Alex Sergey Ionkin, Kennett Square, PA (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 956 days.

(21) Appl. No.: 11/951,953

(22) Filed: Dec. 6, 2007

(65) Prior Publication Data

US 2009/0148631 A1 Jun. 11, 2009

(51) Int. Cl.
*B41M 5/26* (2006.01)
*B41M 5/46* (2006.01)
*G03C 8/00* (2006.01)
*G03F 7/00* (2006.01)

(52) U.S. Cl. ................. 428/32.6; 428/32.52; 428/32.81; 430/200; 430/270.1

(58) Field of Classification Search ........................ None
See application file for complete search history.

(56) References Cited

U.S. PATENT DOCUMENTS

| | | | |
|---|---|---|---|
| 4,782,131 | A | 11/1988 | Sweeny |
| 6,645,681 | B2 | 11/2003 | Andrews et al. |

FOREIGN PATENT DOCUMENTS

| | | | | |
|---|---|---|---|---|
| EP | 0799713 | A1 | | 10/1997 |
| EP | 1 176 028 | | * | 1/2002 |
| EP | 1 186 592 | A1 | | 3/2002 |
| EP | 1342585 | A1 | | 9/2003 |
| WO | WO 03/066339 | | * | 8/2003 |

OTHER PUBLICATIONS

Rosowsky et al., "Methotrexate Analogues. 18. Enhancement of the Antitumor Effect of Methotrexate and 3',5'-Dichloromethotrexate by the Use of Lipid-Soluble Diesters", J. Med. Chem., 26, 1983, pp. 1448-1452.

Cohen et al., "Esterification of Polymeric Carboxylic Acids", J. of Polymer Science, Polymer Chemistry Edition, vol. 14, 1976, pp. 7-22.

Crombez-Robert, et al., "Tin-mediated regioselective etherification and esterification of unprotected xylitol", Carbohydrate Research 307, 1998, pp. 355-359.

International Search Report, International Application No. PCT/US2008/085303, Feb. 20, 2009.

* cited by examiner

*Primary Examiner* — Bruce H Hess

(57) ABSTRACT

The present invention provides compositions derived from a polycarboxylic acid, a polyhydroxy compound, a dye and a basic crosslinking agent. The compositions can be used to prepare cross-linked films that exhibit low solvent-swell characteristics. The cross-linked films can be used to prepare color filter elements via thermal transfer processes.

22 Claims, 1 Drawing Sheet

COMPOSITIONS AND PROCESSES FOR PREPARING COLOR FILTER ELEMENTS USING ALKALI METAL FLUORIDES

FIELD OF THE INVENTION

The present invention provides compositions for preparing cross-linked films that exhibit low solvent-swell characteristics. The films can be used in color filter elements, for example, in liquid crystal display devices.

BACKGROUND

Thermal transfer processes that use radiation to transfer material from a donor element to a receiver element are known. Thermal transfer imaging processes are used in applications such as color proofing, electronic circuit manufacture, the manufacture of monochrome and color filters, and lithography.

Color filters can be manufactured by thermally transferring a layer of colored material from a donor element onto a receiver. Typically, the transferred layer comprises a polymeric material and one or more dyes and/or pigments. The polymeric material can comprise a cross-linkable binder that can be cured to form a more chemically and physically stable layer, one that is less susceptible to damage.

There remains a need, however, to develop compositions that can be used to facilitate the crosslinking process and provide color filters that are more durable and have a longer lifetime.

SUMMARY OF THE INVENTION

Figure 1:
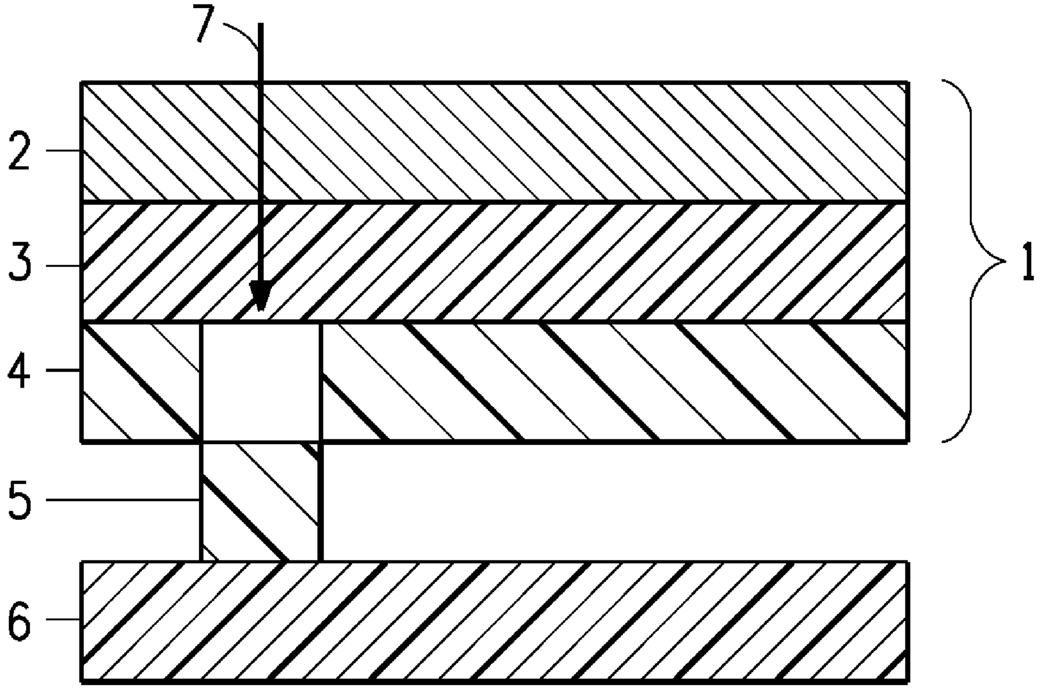
FIG. 1 is a schematic of an imageable assemblage and a thermal laser printing process.

One aspect of the present invention is a thermal transfer donor element comprising:

a. a support; and b. a thermal transfer layer disposed upon the support, wherein the thermal transfer layer is derived from a composition comprising a polycarboxylic acid, a polyhydroxy compound, and a basic crosslinking agent selected from the group consisting of alkali metal fluorides; and c. a laser dye.

Another aspect of the present invention is a process comprising:

a. coating a support with a composition comprising:

(i) a polycarboxylic acid;

(ii) a polyhydroxy compound;

(iii) a basic crosslinking agent selected from the group consisting of alkali metal fluorides; and (iv) a laser dye; and heating the coated support.

Another aspect of the present invention is a process comprising:

a. directing laser radiation to a first surface of a transparent donor support of a donor element of an imageable assemblage, wherein the imageable assemblage comprises a donor element comprising a transparent donor support with a first and second surface, and a thermal transfer layer disposed on the second surface of the support; and a receiver in contact with the thermal transfer layer of the donor element;

b. heating a portion of the thermal transfer layer to cause it to transfer to the receiver; and c. separating the receiver from the donor element.

Another aspect of the present invention is an imageable assemblage comprising:

a. a donor element comprising a transparent donor support with a first and second surface, and a thermal transfer layer disposed on the second surface of the support; and b. a receiver in contact with the thermal transfer layer of the donor element.

DETAILED DESCRIPTION

The present invention provides compositions for preparing cross-linked films that exhibit low solvent-swell characteristics. Precursors of the cross-linked films can be used in donor elements in thermal transfer processes. The cross-linked films can also be used as color filters, for example, in liquid crystal display devices.

In one embodiment, the invention is a thermal transfer donor element comprising a support, a thermal transfer layer disposed upon the support, and a laser dye. As the term is used herein, a "laser dye" is a molecule that is able to absorb radiation energy at the frequency of a chosen incident laser wavelength and convert that energy efficiently into heat. The thermal transfer donor element can further comprise a heating layer disposed between the support and the thermal transfer layer.

The thermal transfer layer is derived from a composition comprising a polycarboxylic acid, a polyhydroxy compound, and a basic crosslinking agent selected from the group consisting of alkali metal fluorides. The thermal transfer layer can further comprise a colorant selected from the group consisting of organic pigments, inorganic pigments, dyes, and combinations thereof.

The term "polycarboxylic acid" refers to an organic acid containing two or more carboxyl (COOH) groups. Herein, the polycarboxylic acid is a copolymer comprising repeat units derived from styrene and one or more carboxylic comonomers, wherein the carboxylic monomer is selected from the group consisting of acrylic acids, methacrylic acids, and combinations thereof. The polycarboxylic acid copolymer used in the thermal transfer layer has a molecular weight of 2,000 to 50,000 g/mole, preferably 3,000 to 14,000 g/mole.

The polyhydroxy compound is selected from the group consisting of 7,7,11,11-tetrakis[2-(2-hydroxyethoxy)ethoxy]-3,6,9,12,15-pentaoxahepta-decane-1,17-diol and $N^1,N^1,N^7,N^7$-tetrakis(2-hydroxyethyl)heptanediamide. The thermal transfer layer can further comprise a surfactant and/or a defoaming agent. Suitable surfactants include salts of 3-[2-(perfluoroalkyl)ethylthio]propionate. Lithium salts are preferred. Suitable defoaming agents include acetylenic glycol non-ionic surfactants.

The polycarboxylic acid and polyhydroxy compound can react to form a cross-linkable polymer.

The "basic crosslinking agent" accelerates the crosslinking of the crosslinkable polymer, and produces an aqueous solution with pH>7 when mixed with water. The basic crosslinking agent is cesium fluoride or rubidium fluoride. The amount of crosslinking that an agent produces can be determined by measuring the swelling of annealed film fragments when exposed to 1-methyl-2-pyrrolidone (NMP). More highly cross-linked films swell less on exposure to NMP than those that are less cross-linked.

The support used in the thermal transfer donor element comprises a material that is dimensionally stable and can withstand the heat of the thermal printing. Suitable support materials are selected from the group consisting of polyester films, polyolefin films, polyamide films, paper, glass, and fluoro-olefin films. Preferred supports are transparent to infrared or near infrared radiation.

If present in the donor element, the heating layer comprises a compound selected from the group consisting of organic and inorganic materials, wherein the materials inherently absorb laser radiations.

The inorganic materials of the heating layer are selected from the group consisting of carbon black, transition metal elements (scandium, yttrium, titanium, zirconium, hafnium, vanadium, niobium, tantalum, chromium, molybdenum, tungsten, manganese, iron, ruthenium, osmium, cobalt, rhodium, iridium, nickel, palladium, platinum, copper, silver, and gold), metallic elements (aluminum, gallium, indium, tin, lead, antimony, and alloys thereof), metal oxides, and alloys of aluminum, gallium, tin, or lead with the alkaline metals or alkaline earth metals (sodium, lithium, calcium, magnesium, and strontium).

The organic materials of the heating layer are laser-radiation absorbing compounds selected from the group consisting of infrared or near infrared absorbing dyes. Examples of suitable near infrared absorbing NIR dyes that can be used alone or in combination include poly(substituted) phthalocyanine compounds and metal-containing phthalocyanine compounds; cyanine dyes; squarylium dyes; croconium dyes; metal thiolate dyes; oxyindolizine dyes; bis(chalcogenopyrylo)polymethine dyes; bis(aminoaryl)polymethine dyes; merocyanine dyes; and quinoid dyes. For imaging applications, it is also typical that the dye has very low absorption in the visible region.

A laser dye is present in the thermal transfer layer and/or a heating layer disposed between the support and the thermal transfer layer. Suitable laser dyes include 1H-benz[e]indolium, 2-[2-[2-chloro-3-[[1,3-dihydro-1,1-dimethyl-3-(4-sulfobutyl)-2H-benz[e]indol-2-ylidene]ethylidene]-1-cyclohexen-1-yl]ethenyl]-1,1-dimethyl-3-(4-sulfobutyl)-, inner salt and related structures.

There is a vast array of pigments known. Pigments are selected for use in the present invention based on their ability to provide the desired color and on their ability to be dispersed in an aqueous formulation. Many pigments are commercially available in dispersed or dispersible form.

In one embodiment, the colorant of the thermal transfer layer comprises a green pigment and a yellow pigment. The green pigment comprises a copper phthalocyanine complex. Suitable copper phthalocyanine complexes include copper, (1,3,8,16,18,24-hexabromo-2,4,9,10,11,15,17,22,23,25-decachlorophthalocyaninato(2-)); and copper, [tridecachloro-29H,31H-phthalocyaninato(2-)-N29,N30,N31,N32]-.

The yellow pigment comprises an azobarbituric acid metal complex. Suitable yellow pigments include nickel, [5,5'-(azo-κN1)bis[2,4,6(1 H,3 H,5 H)-pyrimidinetrionato-κO4](2-)]-, compound with 1,3,5-triazine-2,4,6-triamine.

Suitable red pigments for the thermal transfer layer include 2-(3-oxobenzo[b]thien-2(3H)-ylidene)-benzo[b]thiophene-3(2H)-one and N-(2,3-dihydro-2-oxo-1H-benzimidazol-5-yl )-3-oxo-2-[[2-trifluoromethyl)phenyl]azo]butyramide. Suitable blue pigments for the thermal transfer layer include alpha-copper phthalocyanine and diindolo[2,3-c:2',3'-n] triphenodioxazine, 9,19-dichloro-5,15-diethyl-5,15-dihydro-.

Mixtures of pigments and/or dyes can be used to produce other colors, such as orange or purple.

In another embodiment, the invention is a process for preparing a thermal transfer donor element comprising: coating a support with a composition comprising a polycarboxylic acid, a polyhydroxy compound, a basic crosslinking agent selected from the group consisting of alkali metal fluorides, and a laser dye to form a coated support; and heating the coated support.

The composition used to coat the support is typically prepared as an aqueous formulation comprising 25 to 40 wt % polycarboxylic acid, 2 to 10 wt % basic crosslinking agent, and 1 to 15 wt % polyhydroxy compound, based on the total weight of the aqueous formulation. In some embodiments, 2 to 8 wt % of the aqueous formulation is the polyhydroxy compound. The composition can further comprise colorants selected from the group consisting of organic pigments, inorganic pigments, dyes, and combinations thereof; surfactants; de-foaming agents; and other additives.

The aqueous formulation is mixed by any of several conventional mixing techniques, and then coated onto the support by any of several conventional coating techniques. One method is described in Example 3.

The coated support can be heated from 40° C. to 60° C. to obtain a dry film of the thermal transfer layer on the support.

The coated support is heated from 40° C. to 60° C. to obtain a dry film of the thermal transfer layer on the support.

The thermal transfer layer can be further heated to 200° C. to 300° C. to produce an annealed film on the support. Example 2 demonstrates that annealed film produced from a formulation that contains a basic crosslinking agent is more solvent resistant than a film produced from a formulation that does not contain such an agent.

The thermal transfer layer can be further heated to 200° C. to 300° C. to produce an annealed film on the support. Example 2 demonstrates that annealed film produced from a formulation that contains a basic crosslinking agent is more solvent resistant than a film produced from a formulation that does not contain such an agent.

Alternatively, the thermal transfer layer can be transferred to a receiver by, for example, a thermal laser printing process before annealing. FIG. 1 depicts one embodiment of a thermal transfer donor element (1) comprising a support (2), an optional heating layer (3), and a thermal transfer layer (4). FIG. 1 also depicts a thermal laser printing process, in which laser radiation is directed to the heating layer, causing a portion (5) of the thermal transfer layer to be released from the donor element and be transferred to the receiver (6).

One embodiment of the present invention is an imageable assemblage comprising:

a. a donor element comprising a transparent donor support with a first and second surface, and a thermal transfer layer disposed on the second surface of the support, wherein the thermal transfer layer is derived by heating to 40° C. to 60° C. a composition comprising a polycarboxylic acid, a polyhydroxy compound, and a basic crosslinking agent selected from the group consisting of alkali metal fluorides; and b. a receiver in contact with the thermal transfer layer of the donor element.

The donor element can further comprise a heating layer disposed between the donor support and the thermal transfer heating layer.

The receiver is selected from the group consisting of polyester films, polyolefin films, polyamide films, paper, sheets of glass, and fluoro-olefin films. For convenience, the terms "sheet" and "film" may be used interchangeably herein. One skilled in the art knows that sheet can be distinguished from film based on thickness. The thickness of a sheet or film is not critical for the present invention, and commercially available sheets and films of suitable materials can be used.

Another embodiment of the present invention is a process comprising directing laser radiation to the first surface of a transparent donor support of the donor element of an imageable assemblage; heating a portion of the thermal transfer layer to cause it to transfer to the receiver; and separating the receiver from the donor element.

This thermal laser printing process can be used to make a "color filter element" for use in a liquid crystal display. A color filter element typically includes many three-color pixels, each pixel having three windows, and each window having a different color filter (usually red, blue and green). The color filters partially transmit visible light, so that white light is filtered to become red, blue, and green light after passing through the three filters. The windows can be defined by a black matrix. The arrangement of windows of the same color is commonly mosaic, stripe, or delta patterning.

EXAMPLES

The present invention is further illustrated in the following Examples. These examples are given by way of illustration only. From the above discussion and these examples, one skilled in the art can ascertain the essential characteristics of the present invention, and without departing from the spirit and scope thereof, can make various changes and modifications to adapt it to various uses and conditions.

General Information:

Unless otherwise specified below all chemical reagents were obtained from the Sigma Chemical Co. (St. Louis, Mo.) or Aldrich (Milwaukee, Wis.). Pigments were obtained from Penn Color (Doylestown, Pa.).

Carboset® GA 2300 is a carboxylic-acid-containing binder acrylic copolymer (available from Noveon, Inc., Cleveland, Ohio) having a carboxylic acid concentration of approximately 3.6 mM (millimoles) carboxylic acid per gram binder, a Mw of approximately 11,000 grams per mole, and a glass transition temperature of about 70° C., available in a volatile carrier.

SDA-4927 is 2-[2-[2-chloro-3[2-(1,3-dihydro-1,1dimethyl-3-(4-dimethyl-3(4-sulfobutyl)-2H-benz[e]indol-2-ylidene)ethylidene]-1-cyclohexen-1-yl]ethenyl]-1,1-dimethyl-3-(sulfobutyl)-1H-benz[e]indolium, inner salt, free acid [CAS No. 162411-28-1]. SDA-4927 (H.W. Sands Corp., Jupiter, Fla.) is an infrared dye that absorbs light of wavelength about 830 nm.

"FS1" is a fluorosurfactant containing a salt of 3-[2-(perfluoroalkyl)ethylthio]propionate, and is available from E. I. du Pont de Nemours and Company, Wilmington, Del.

32G373D is a green pigment that contains (1,3,8,16,18,24-hexabromo-2,4,9,10,11,15,17,22,23,25-decachlorophthalocyaninato(2-)). 32G459D is a green pigment that contains copper, [tridecachloro-29H,31H-phthalocyaninato(2-)-N29, N30,N31,N32]-. 15599-52 is a yellow pigment that contains nickel, [[5,5'-(azo-κN1)bis[2,4,6(1 H,3 H,5 H)- primidinetrionato-κO4]](2-)]-, compound with 1,3,5-triazine-2,4,6-triamine.

32R364D is a red pigment that contains (2-(3-oxobenzo[b] thien-2(3H)-ylidene)-benzo[b]thiophene-3(2H)-one). 32Y154D is a red shade yellow pigment that contains (N-(2, 3-dihydro-2-oxo-1H-benzimidazol-5-yl)-3-oxo-2-[[2-trifluoromethyl)phenyl]azo]butyramide).

32S412D is a blue pigment that contains (alpha-copper phthalocyanine). 32S349D is a blue pigment that contains (diindolo[2,3-c:2',3'-n]triphenodioxazine, 9,19-dichloro-5, 15-diethyl-5,15-dihydro-).

Polyol DPP®130 is poly(oxy-1,2-ethanediyl), -hydro-T-hydroxy-, ether with 2,2'-(oxybis(methylene))bis(2-hydroxymethyl)-1,3-propanediol) (6:1) (CAS No. 50977-32-7). Polyol DPP®130 is an ethoxylated dipentaerythritol polymer clear liquid (Perstorp Polyols Inc, Toledo, Ohio).

Surfynol® DF 110D is a non-ionic, non-silicone, acetylenic-based defoamer for aqueous systems available from Air Products and Chemicals Inc., Allentown, Pa.

Primid® XL-552 is a hydroxyalkylamide crosslinker (bis [N,N'-di(beta-hydroxy-ethyl)]adipamide), available from Rohm and Haas.

Example 1

Preparation of Formulations

De-ionized water and Carboset® GA 2300 solution (density=1.066 g/L) were added to a vial, followed by addition of pigments. The mixture was shaken for 5 min. SDA 4927 IR dye was then added, followed by the addition of the polyhydroxy compound, FS1, and Surfynol® DF 110D (0.030 g). Finally, the basic cross-linking catalyst was added and the mixture was shaken for 2 to 12 h.

The amount of water, pigments, Carboset® GA 2300 solution, polyhydroxy compound and crosslinking agent used in each formulation (Samples 1-4 and Comparative Examples A-B) is given in Table 1.

TABLE 1

Composition of Pigmented Formulations

| Sample | Water | Polycarboxylic acid | Polyol 0.240 g | Pigment 1 | Pigment 2 | Pigment 3 | Dye SDA 4927 | Crosslinking Agent |
|---|---|---|---|---|---|---|---|---|
| 1 | 5.519 g | 4.894 g | Polyol DPP ® 130 | 32G373D 1.25 g | 32G459D 0.374 g | 15599-52 1.522 g | 1.5 g 1 wt % | Rb fluoride 0.15 g |
| 2 | 5.519 g | 4.5 g | Polyol DPP ® 130 | 32G373D 1.25 g | 32G459D 0.374 g | 15599-52 1.522 g | 1.5 g 1 wt % | Cs fluoride 0.15 g |
| 3 | 5.519 g | 5.117 g | Primid ® XL-552 | 32G373D 1.25 g | 32G459D 0.374 g | 15599-52 1.522 g | 1.5 g 1 wt % | Rb fluoride 0.06 g |
| 4 | 5.519 g | 5.43 g | Primid ® XL-552 | 32G373D 1.25 g | 32G459D 0.374 g | 15599-52 1.522 g | 1.5 g 1 wt % | Cs fluoride 0.06 g |
| A | 5.035 g | 4.983 g | Polyol DPP ® 130 | 32G373D 1.25 g | 32G459D 0.374 g | 15599-52 1.522 g | 1.5 g 1 wt % | None |
| B | 3.290 g | 5.344 g | Primid ® XL-552 | 32G373D 1.25 g | 32G459D 0.374 g | 15599-52 1.522 g | 1.5 g 1 wt % | None |

Example 2

Swell Tests

Preparation of Films:

100 to 200 μL of a formulation prepared as in Example 1 was dropped onto a sheet of Teflon® film (10 cm x 20 cm) and a drawdown bar is used to make a uniform thickness film on the Teflon® film. The sheet was heated in an oven at 100° C. for 10 minutes, annealed at 230° C. for 45 min, and then allowed to cool.

Swell Test Procedures and Results:

A few scrapings of the cooled, annealed film were placed on a microscope slide and covered with a cover slip. One of the film fragments was measured (by microscope) to determine its size. NMP (1-methyl-2-pyrrolidone, 10 μl) was added to the slide to contact the film fragment. The dimensions of the film fragment were measured after 10, 30, 60, 90, and 120 min, and again after 1440 min.

Table 2 summarizes the swell test results (T/T0) at different times for films that were prepared with or without the listed alkali metal fluoride cross-linking agents.

TABLE 2

Swell test results (T/T0)

| Crosslinking Agent/ Polycarboxylic Acid (Sample #) | Time in Minutes 0 | 10 | 60 | 120 | 1440 |
|---|---|---|---|---|---|
| RbF/Polyol DPP ® 130 (1) | 1.00 | 1.00 | 1.02 | 1.04 | 1.12 |
| CsF/Polyol DPP ® 130 (2) | 1.00 | 1.00 | 1.01 | 1.04 | 1.05 |
| RbF/Primid ® XL-552 (3) | 1.00 | 1.00 | 1.00 | 1.02 | 1.12 |
| CsF/Primid ® XL-552 (4) | 1.00 | 1.00 | 1.00 | 1.03 | 1.05 |
| None/Polyol DPP ® 130 (A) | 1.00 | 1.25 | 1.25 | 1.25 | 1.25 |
| None/Primid ® XL-552 (B) | 1.00 | 1.25 | 1.25 | 1.25 | 1.25 |

T0: The length of the film fragment before exposure to NMP.
T: The length of the film fragment after exposure to NMP for 10-1440 min.

These results demonstrate that use of an alkali metal fluoride cross-linking agent reduces the amount of swelling when annealed film is exposed to NMP.

Example 3

General Procedure for Making Donor Elements and Imaging

After a pigmented formulation mixture of Example 1 had been shaken for several hours, the pigmented formulation (10 ml) was placed in a syringe filter and filtered through a 1 μm syringe filter onto a polyester sheet in front of the draw-down bar. The draw-down bar deposited the formulation uniformly across the polyester sheet. The coated polyester sheet was heated in a drying oven for 5 min to form a thermal transfer layer on the polyester sheet.

Imaging was carried out by contacting the thermal transfer layer with a receiver (a glass sheet), and directing laser radiation through the transparent donor support (the polyester sheet) and onto the thermal transfer layer. The portion of the thermal transfer layer that had been exposed to the laser radiation was transferred to the glass and remained on the glass when the polyester sheet and the receiver were separated.

Example 4

Color Filter Height Reduction

The thermal transfer process described in Example 3 was used to prepare a panel of three-color pixels, where each pixel contained a red, a blue, and a green color filter, and each color filter was separated from other color filters by a rubber black matrix (RBM). In this test, one color filter of each set of three was derived from a formulation that contained a cross-linking agent and the other two color filters contained no cross-linking agent. After annealing, the panel was analyzed using a KLA-Tencor Profilometer to determine the height of each color filter above the RBM level.

As can be seen in Table 3, the height of the color filter that contains a crosslinking agent has been reduced more than color filters without such an agent. This can be advantageous by facilitating the production of color filter elements with more intensely-colored color filters.

TABLE 3

Catalyst vs. Color Filter Height after Annealing

| Pixel Color | Formulation Sample | Crosslinking Agent | Cross-Linker | Height (μm) |
|---|---|---|---|---|
| Green | 2 | CsF | Polyol DPP ® 130 | 0.19 |
| Green | A | None | Primid ® XL-552 | 0.58 |

What is claimed is:

1. A donor element for use in a thermal transfer process comprising:

a. a support;

b. a thermal transfer layer disposed upon the support, wherein the thermal transfer layer is derived from a composition comprising a polycarboxylic acid, a polyhydroxy compound, and a basic crosslinking agent selected from the group consisting of alkali metal fluorides; and c. a laser dye, wherein the laser dye is either present in the transfer layer or is present in the heating layer disposed between the support and the thermal transfer layer.

2. The donor element of claim 1, wherein the polycarboxylic acid is a copolymer comprising repeat units derived from: styrene and a carboxylic monomer selected from the group consisting of acrylic acids, methacrylic acids, and combinations thereof.

3. The donor element of claim 2, wherein the copolymer has a molecular weight of 2,000 to 50,000 Da.

4. The donor element of claim 1, wherein the polyhydroxy compound is selected from the group consisting of:

a. 7,7,11,11-tetrakis[2-(2-hydroxyethoxy)ethoxy]-3,6,9,12,15-pentaoxahepta-decane -1,17-diol; and b. $N^1,N^1,N^7,N^7$-tetrakis(2-hydroxyethyl)heptanediamide.

5. The donor element of claim 1, wherein the basic crosslinking agent is cesium fluoride or rubidium fluoride.

6. The donor element of claim 1, wherein the thermal transfer layer further comprises a colorant selected from the group consisting of organic pigments, inorganic pigments, dyes, and combinations thereof.

7. The donor element of claim 6, wherein the colorant comprises a green pigment, a yellow pigment and a laser dye.

8. The donor element of claim 7, wherein the green pigment comprises a copper phthalocyanine complex and the yellow pigment comprises an azobarbituric acid metal complex.

9. The donor element of claim 8, wherein the copper phthalocyanine complex is selected from the group consisting of:

a. copper, (1,3,8,16,18,24-hexabromo-2,4,9,10,11,15,17,22,23,25-decachlorophthalocyaninato(2-)); and b. copper, [tridecachloro-29H,31H-phthalocyaninato(2-)-N29,N30,N31,N32]-; and the yellow pigment comprises nickel, [[5,5'-(azo-κN1)bis[2,4,6(1H,3H,5H)-pyrimidinetrionato-κO4]](2-)]-, compound with 1,3,5-triazine-2,4,6-triamine.

10. The donor element of claim 1, wherein the laser dye is 1H-benz[e]indolium, 2-[2[2-chloro-3-[[1,3-dihydro-1,1-dimethyl-3-(4-sulfobutyl)-2H-benz[e]indol-2-ylidene]ethylidene]-1-cyclohexen-1-yl]ethenyl]-1,1-dimethyl-3-(4-sulfobutyl)-, inner salt.

11. The donor element of claim 1, wherein the thermal transfer layer further comprises a surfactant and a defoaming agent.

12. The donor element of claim 11, wherein the surfactant is lithium 3-[2-(perfluoroalky)ethylthio]propionate and the defoaming agent is an acetylenic glycol nonionic surfactant.

13. The donor element of claim 1, further comprising a heating layer disposed between the support and the thermal transfer layer.

14. The donor element of claim 13, wherein the heating layer comprises a material selected from the group consisting of carbon black, scandium, titanium, chromium, manganese, iron, cobalt, nickel, copper, ruthenium, rhodium, palladium, silver, gold, and hafnium; aluminum, gallium, tin, lead and alloys thereof; metal oxides; and alloys of aluminum, gallium, tin, or lead with sodium, lithium, calcium, magnesium, or strontium; poly(substituted) phthalocyanine compounds and metal-containing phthalocyanine compounds; cyanine dyes; squarylium dyes; chalcogenopyryioacrylidene dyes; croconium dyes; metal thiolate dyes; oxyindolizine dyes; bis(chalcogenopyrylo)polymethine dyes; bis(aminoaryl) polymethine dyes; merocyanine dyes; and quinoid dyes.

15. The donor element of claim 1, wherein the support is selected from the group consisting of polyester films, polyolefin films, polyamide films, paper, sheets of glass, and fluoro-olefin films.

16. A process comprising:

a. coating a support with a composition comprising:
  (i) a polycarboxylic acid;
  (ii) a polyhydroxy compound;
  (iii) a basic crosslinking agent selected from the group consisting of alkali metal fluorides; and
  (iv) a laser dye; and b. heating the coated support.

17. The process of claim 16, wherein the composition is an aqueous composition and the polycarboxylic acid comprises 25 to 40 wt % of the composition, the basic crosslinking agent comprises 2 to 10 wt % of the composition and the organic compound comprises 1 to 15 wt % of the composition.

18. The process of claim 17, wherein the aqueous composition further comprises a colorant selected from the group consisting of an organic pigment, an inorganic pigment, a dye, a color-forming dye and combinations thereof.

19. The process of claim 16, wherein the heating comprises (i) heating the coated sheet from 40° C. to 60° C. to obtain a dry film; and (ii) heating the dry film from 200° C. to 300° C. to form an annealed film.

20. An imageable assemblage comprising:

a. a donor element comprising a transparent donor support with a first and second surface, and a thermal transfer layer disposed on the second surface of the support, wherein the thermal transfer layer is derived by heating to 40° C. to 60° C. a composition comprising a polycarboxylic acid, a polyhydroxy compound, and a basic crosslinking agent selected from the group consisting of alkali metal fluorides; and b. a receiver in contact with the thermal transfer layer of the donor element.

21. The imageable assemblage of claim 20, wherein the donor element further comprises a heating layer disposed between the donor support and the thermal transfer heating layer.

22. A process comprising:

a. directing laser radiation to a first surface of a transparent donor support of a donor element of an imageable assemblage, wherein the imageable assemblage comprises a donor element comprising a transparent donor support with a first and second surface, and a thermal transfer layer disposed on the second surface of the support, wherein the thermal transfer layer is derived by heating to 40° C. to 60° C. a composition comprising a polycarboxylic acid, a polyhydroxy compound, and a basic crosslinking agent selected from the group consisting of alkali metal fluorides; and a receiver in contact with the thermal transfer layer of the donor element;

b. heating a portion of the thermal transfer layer to cause it to transfer to the receiver; and c. separating the receiver from the donor element.

* * * * *